United States Patent
Bessler

(12) 
(10) Patent No.: US 6,552,525 B2
(45) Date of Patent: Apr. 22, 2003

(54) SYSTEM AND METHOD FOR SCHEDULING AND MONITORING ELECTRICAL DEVICE USAGE

(75) Inventor: Warren Frank Bessler, Amsterdam, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/681,290

(22) Filed: Mar. 14, 2001

(65) Prior Publication Data

US 2002/0130652 A1 Sep. 19, 2002

(51) Int. Cl.$^7$ ............................................. G01R 19/00
(52) U.S. Cl. .............. 324/103 R; 324/142; 340/825.06; 340/870.02
(58) Field of Search ............................ 340/870.05, 310, 340/825.06, 310.02, 870.02, 800.11; 324/158.1, 103 R, 142, 141

(56) References Cited

U.S. PATENT DOCUMENTS

| | | | |
|---|---|---|---|
| 4,644,320 A | | 2/1987 | Carr et al. .................. 340/319 |
| 4,998,024 A | * | 3/1991 | Kirk et al. .............. 340/310 R |
| 5,818,725 A | * | 10/1998 | McNamara et al. ... 340/870.13 |
| 5,880,677 A | * | 3/1999 | Lestician ............... 340/825.06 |
| 6,061,604 A | * | 5/2000 | Russ et al. ............. 340/825.52 |

* cited by examiner

Primary Examiner—Kamand Cuneo
Assistant Examiner—Jimmy Nguyen
(74) Attorney, Agent, or Firm—Armstrong Teasdale LLP

(57) ABSTRACT

A system for scheduling and monitoring usage of an electrical household appliance includes an electronic controller and at least one sensor connectible to one another and to the appliance to respectively control operation of the appliance and to detect the amount of electrical power supplied to the appliance, and a computer connectible with the electronic controller and with the Internet for providing communications therebetween and for receiving instructions inputted by a service provider via the Internet and by a user and producing an output to the electronic controller for scheduling and monitoring the operation of the appliance via the electronic controller.

14 Claims, 1 Drawing Sheet

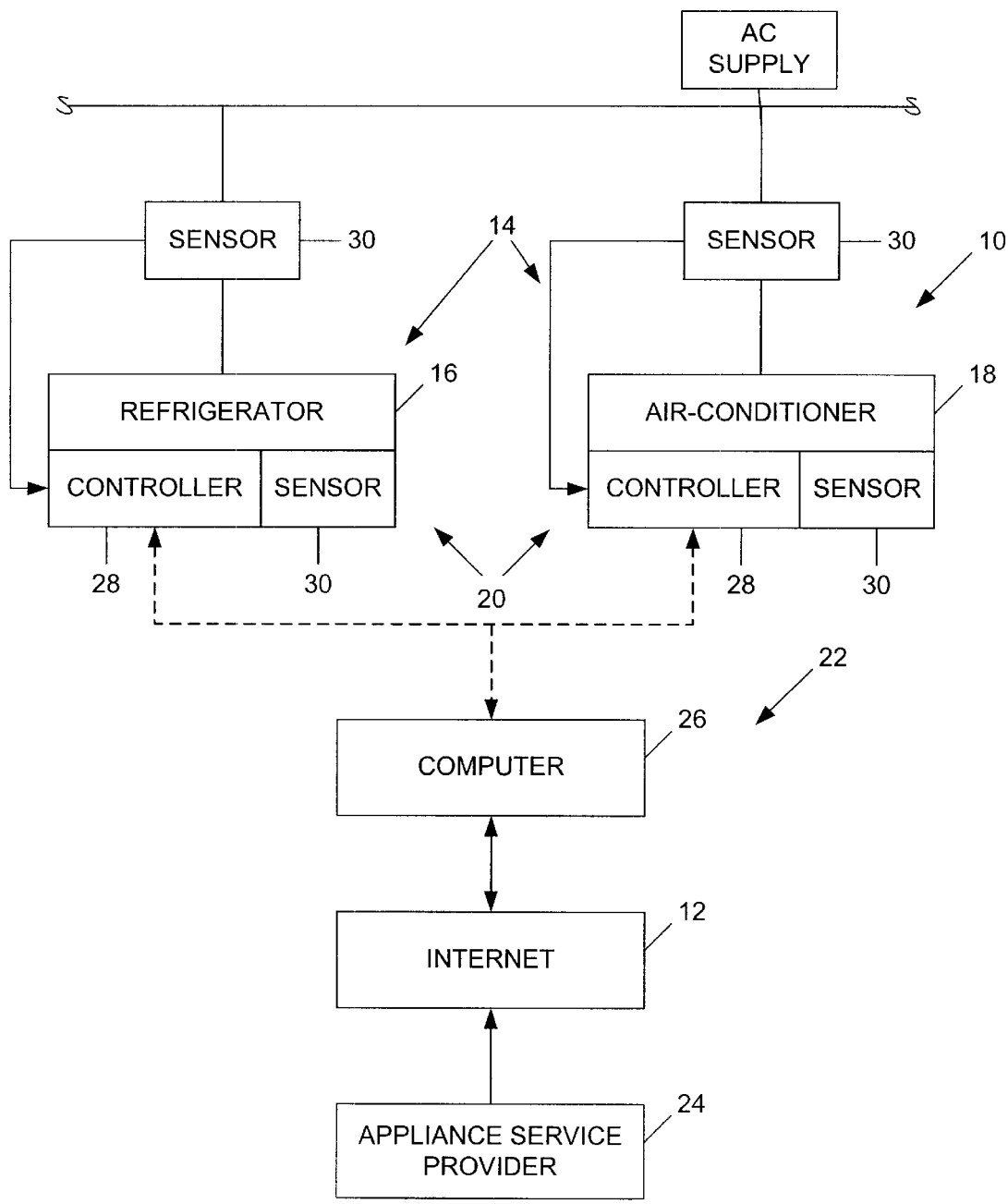

SYSTEM AND METHOD FOR SCHEDULING AND MONITORING ELECTRICAL DEVICE USAGE

BACKGROUND OF INVENTION

The present invention generally relates to operation of electrical devices, for example, conventional household appliances such as refrigerators and air conditioners and, more particularly, is concerned with a system and method for scheduling and monitoring usage of such electrical devices.

Consumers are increasingly facing electricity pricing variations based on energy usage demand and/or time of the day energy usage. As a result, it has become desirable to know the quantity of energy usage by various electrical devices, such as conventional household appliances and the levels of energy usage occurring during different periods of the day.

Residential energy monitoring systems have been proposed for use by utility companies for remotely and automatically monitoring the aggregate household energy usage of a plurality of homes within a given area. These systems are intended to obviate the need for "meter readers" who personally inspect the utility meters of residences and record monthly energy usage. Remote automatic meter reading systems typically transmit power usage information over telephone lines, power lines or by radio communication links. The principal drawback of these proposed systems is that the energy consumption data is extracted solely from utility meters and as such does not provide any information regarding energy consumption of the individual electrical devices within the household.

A home energy usage monitoring and control system located in a residence for monitoring energy usage of individual household appliances is disclosed in U.S. Pat. No. 4,664,320 to Carr et al. This system envisions transmitting energy usage information over conventional AC wiring of the residence to a master control station in the residence which may then display the energy usage information in various formats according to the desires of the consumer. The system proposes an energy monitor unit connected to each appliance which includes a transceiver or modem capable of communication over 60-Hz AC house wiring. Each of these modems communicates with a second modem at the master control station.

With the advent of the Internet, a need has arisen for an innovation that will exploit the enhanced communications and information accessing and gathering capabilities of the Internet for enhancing the operation of electrical devices.

SUMMARY OF INVENTION

The present invention provides a system and method for scheduling and monitoring usage of an electrical device, such as a household appliance, based at least partially on information accessed and received via connection to the Internet. The system and method of the present invention facilitates the scheduling and monitoring of usage of the electrical device so as to primarily lower the energy usage expenses thereof and secondarily improve preventive maintenance thereof.

In one embodiment of the present invention, a system for scheduling and monitoring usage of an electrical device is provided which comprises means for controlling operation of the electrical device and means connectible with the operation controlling means and with the Internet for providing communications therebetween and for receiving instructions inputted by a service provider via the Internet and by a user and producing an output to the operation controlling means for scheduling and monitoring the operation of the electrical device via the operation controlling means. More particularly, the communications providing means is a computer and the operation controlling means includes an electronic controller connected to the computer and the electrical device and at least one sensor connected to the electronic controller and the electrical device such that the sensor is capable of detecting the amount of electrical power supplied to the electrical device.

In another embodiment of the present invention, a method for scheduling and monitoring usage of an electrical device is provided which comprises the steps of connecting an electronic controller to the electrical device for controlling operation of the device, providing communications between the electronic controller and the Internet, receiving instructions inputted by a service provider via the Internet and by a user, and producing an output to the electronic controller for scheduling and monitoring the operation of the electrical device via the electronic controller and the Internet. The method further comprises the steps of connecting at least one sensor to the electronic controller and the electrical device such that the sensor is capable of detecting the amount of electrical power supplied to the electrical device, and connecting a computer to the electronic controller and to the Internet to provide the communications between the electronic controller and the Internet and to receive the instructions inputted by the user and service provider via the Internet and to produce the output to the electronic controller.

BRIEF DESCRIPTION OF DRAWINGS

The FIGURE is a block diagram of an Internet-connected system for scheduling and monitoring usage of electrical devices such as household appliances.

DEFINITION SECTION

As used herein, the term "Computer" means a programmable device that responds to a specific set of instructions. A computer can be electronic or digital. The actual machinery, for example, wires, transistors, and circuits is called hardware and the instructions are called software. Most computers typically comprise: a memory that enables a computer to store, at least temporarily, data and programs; a mass storage device that allows a computer to permanently retain large amounts of data (common mass storage devices include disk drives and tape drives); an input device, for example, a keyboard or mouse, through which data and instructions enter a computer; an output device for example a display, screen or printer or other device that lets you see what the computer has accomplished; and a central processing unit (CPU), the component that executes instructions. In addition to these components, many other components make it possible for the basic components to work together efficiently. For example, most computers have a bus that transmits data from one part of the computer to another. Some examples of typical computers are a personal computer, a workstation, a minicomputer, multi-user computer, a mainframe, or a supercomputer.

As used herein, the term "Database" means a collection of organized data. The data is typically organized for rapid search and retrieval by a computer.

As used herein, the term "Internet" means a global network of computers.

As used herein, the term "Intranet" means a secure network, typically belonging to an organization, for example, a corporation, accessible only by that organization's members, employees, or others with appropriate authorization, for storage and sharing of information.

As used herein, the term "Media" means at least one of a RAM, A ROM, a disk, a DVDROM, a CDROM, an ASIC, a PROM, or any other type of storage means.

As used herein, the term "Network" means a group of two or more computers linked together. There are many types of networks, including: local-area networks (LANs), where the computers are geographically close together, typically, in the same building, and wide area networks (WANs) where the computers are farther apart and are connected by telephone lines or radio waves. In addition to these types, the following characteristics are also used to categorize different types of networks: topology is the geometric arrangement of a computer system (common topologies include a bus, a star, and a ring); the protocol defines a common set of rules and signals that computers on the network use to communicate (one of the most popular protocols for LANs is called Ethernet). Networks can be broadly classified as using either a peer-to-peer or client/server architecture. Computers on a network are sometimes called nodes. Computers and devices that allocate resources for a network are called servers.

DETAILED DESCRIPTION

Referring now to the drawing, the FIGURE schematically illustrates a system, generally designated 10, for connection to the Internet 12 and adapted for use in scheduling and monitoring energy usage of one or more electrical devices 14, for example, household appliances such as a conventional refrigerator 16 and a conventional air-conditioner 18. The system 10 basically includes means 20 for controlling operation of the appliances 16, 18 and means 22 connectible with the operation controlling means 20 and with the Internet 12 for providing communications therebetween and for receiving instructions inputted by a service provider 24 via the Internet 12 and by a user and producing an output to the operation controlling means 20 for scheduling and monitoring the operation of the appliances 16, 18 via the operation controlling means 20.

The communications providing means 22 of the system 10 can advantageously, though not necessarily, take the form of a computer 26, such as a conventional personal computer. The operation controlling means 20 of the system 10 includes at least one electronic controller 28 and one or more sensors 30 used with each of the appliances 16, 18. The number of sensors 30 used with each of the appliances 16, 18 depends upon the number of operating parameters of each appliance that are to be sensed. At least one of the sensors 30 is connected to the respective appliance 16, 18 so as to be enable detecting the amount of electrical power supplied to the appliance 16, 18. Each sensor 30 can be a suitable off-the-shelf conventional transducer particularly adapted to sense or detect a signal or movement representative to the particular parameter of the equipment 12 being sensed. The sensor 30 is connected with the appliance 16, 18 at a location thereon where the sensor 30 will be function to produce an electrical output signal in response to a monitored component, such as an electric supply cord, an electric motor or a rotating shaft, of the appliance 16, 18 that provides an indication of the current condition of the parameter being monitored. Each electronic controller 28 can be a suitable off-the-shelf conventional microcontroller or microprocessor connected to one or more of the sensors 30 of the respective one of the appliances 16, 18 and programmed to monitor the appliance via the sensor(s) 30 and to receive the electrical output signals therefrom representing the parameters being monitored. The electrical signals are temporarily stored by the electronic controller 28 and produce electrical outputs that are indications of the current condition of the monitored parameters. The computer 26 is connected to each of the electronic controller 28 and to the Internet 12 for providing communications therebetween.

For ease of implementation in a household environment, a communications link can be established between the computer 26 and electronic controllers 28 of the system 10 of the present invention using any suitable technique. One suitable technique is to employ a Bluetooth technology-based platform such as described in detail in an article entitled "BLUETOOTH—The universal radio interface for ad hoc, wireless connectivity" by Jaap Haartsen, published in *Ericsson Review*, No. 3, 1998, pp. 110–117. Bluetooth technology provides for local wireless connectivity between electronic devices. In particular, it is a universal radio interface in the 2.45 GHz frequency band that enables electronic devices to connect and communicate wirelessly via a short-range ad hoc network, such as can be formed by the appliance electronic controllers 28 and the computer 26.

The primary benefit derived from the system 10 of the present invention is the reduction of energy usage by electrical devices, such as household appliances, and its associated costs during times of peak energy use. A secondary benefit is the knowledge the service provider 24 can obtain regarding how the appliances are used and their operating performance over time. This could reduce service call rates with preventive maintenance. For example, the refrigerator 16, via its electronic controller 28, the computer 26 and the Internet 12, would communicate with the service provider 26 and learn the electricity pricing schedule. Energy intensive events such as defrost would be scheduled during off peak times. The refrigerator run time, waits, compartment set points, door openings and ambient temperature could be monitored by the service provider to determine if the appliance is healthy, deteriorating, or damaged. Comparable parameters could be monitored with respect to the residential air-conditioner 18. Additional knowledge accessed through the Internet 12 regarding weather forecasts could be used to lower temperature set points in advance of very hot humid weather when high energy prices would be expected. The system 10 would also enable the service provider 24 to present timely sales promotions transmitted via the Internet 12 to the consumers' households.

It is thought that the present invention and its advantages will be understood from the foregoing description and it will be apparent that various changes may be made thereto without departing from the spirit and scope of the invention or sacrificing all of its material advantages, the form hereinbefore described being merely preferred or exemplary embodiment thereof.

What is claimed is:

1. A system for scheduling and monitoring usage of an electrical device, said system comprising:

means for controlling operation of an electrical device including at least one first sensor connected to the electrical device for detecting an amount of electrical power supplied to the electrical device, and at least one second sensor connected to the electrical device for detecting at least one non-electrical parameter of the electrical device; and means connectable with said operation controlling means and with the Internet for providing communications therebetween and for receiving instructions inputted by a service provider via the Internet and by a user and producing an output to said operation controlling means for scheduling and monitoring the operation of the electrical device via said operation controlling means.

2. The system of claim 1 in which said communications providing means is a computer.

3. The system of claim 2 in which said operation controlling means includes an electronic controller connected to the electrical device and to said computer.

4. The system of claim 1 in which said operation controlling means further includes an electronic controller connected to said sensor.

5. The system of claim 4 in which said electronic controller further is connected to the electrical device.

6. The system of claim 5 in which said communications providing means is a computer.

7. The system of claim 6 in which said electronic controller further is connected said computer.

8. In combination with at least one electrical household appliance, a system for scheduling and monitoring usage of the household appliance, said system comprising:

means for controlling operation of said appliance based on an amount of detected electrical power supplied to the electrical household appliance, and based on a detected non-electrical parameter of the electrical household appliance; and means connectable with said operation controlling means and with the Internet for providing communications therebetween and for receiving instructions inputted by a service provider via the Internet and by a user and producing an output to said operation controlling means for scheduling and monitoring the operation of said appliance via said operation controlling means.

9. The combination of claim 8 in which said communications providing means is a computer.

10. The combination of claim 9 in which said operation controlling means includes an electronic controller connected to said appliance and to said computer.

11. The combination of claim 10 in which said operation controlling means further includes at least one sensor connected to said electronic controller and to said appliance such that said sensor is capable of detecting the amount of electrical power supplied to said appliance.

12. A method for scheduling and monitoring usage of an electrical device, said method comprising the steps of:

connecting an electronic controller to an electrical device for controlling operation of the device providing communications between the electronic controller and the Internet; receiving instructions inputted by a user and by a service provider connected to the electronic controller via the Internet;

producing an output to the electronic controller for scheduling and monitoring the operation of the electrical device via the electronic controller and the Internet; and connecting at least one first sensor to the electrical device for detecting an amount of electrical power supplied to the electrical device, and connecting at least one second sensor to the electrical device for detecting at least one non-electrical parameter of the electrical device.

13. The method of claim 12 further comprising the step of:

connecting the electronic controller to at least one sensor.

14. The method of claim 12 further comprising the step of:

connecting a computer to the electronic controller and to the Internet to provide the communications between the electronic controller and the Internet and to receive the instructions inputted by the service provider via the Internet and by the user and to produce the output to the electronic controller.

* * * * *